United States Patent [19]
Watanabe

[11] Patent Number: 5,824,564
[45] Date of Patent: Oct. 20, 1998

[54] METHOD OF MANUFACTURING THIN-FILM TRANSISTOR ARRAY SUBSTRATE

[75] Inventor: Takahiko Watanabe, Tokyo, Japan

[73] Assignee: Nec Corporation, Tokyo, Japan

[21] Appl. No.: 806,987

[22] Filed: Feb. 26, 1997

[30]  Foreign Application Priority Data

Feb. 28, 1996 [JP] Japan .................................... 8-041049

[51] Int. Cl.[6] .............................. H01L 21/00; H01L 21/84
[52] U.S. Cl. ............................................... 438/30; 438/164
[58] Field of Search ............................ 438/30, 164, 169, 438/29, 183

[56]  References Cited

U.S. PATENT DOCUMENTS

| | | | |
|---|---|---|---|
| 5,008,218 | 4/1991 | Kawachi et al. | 438/164 |
| 5,231,039 | 7/1993 | Sakono et al. | 438/30 |
| 5,422,293 | 6/1995 | Konya | 438/30 |
| 5,432,108 | 7/1995 | Lee | 438/30 |
| 5,656,526 | 8/1997 | Inada et al. | 438/30 |

FOREIGN PATENT DOCUMENTS 63-131578   6/1987   Japan ..................................... 438/183

*Primary Examiner*—John F. Niebling
*Assistant Examiner*—Michael S. Lebentritt
*Attorney, Agent, or Firm*—Young & Thompson

[57]  ABSTRACT

In a thin film transistor array substrate, when a light shield pattern is formed in the space between a wiring group and a transparent electrode film, a trench which makes it possible to reduce bright spot defects is formed in an insulating film without revealing a light shielding film, by intentionally leaving a part of an a-Si film which is a semiconductor film constituting a thin film transistor. Accordingly, it is possible to manufacture a thin film transistor array substrate with less bright spot defects without increasing the number of manufacturing processes.

8 Claims, 3 Drawing Sheets

METHOD OF MANUFACTURING THIN-FILM TRANSISTOR ARRAY SUBSTRATE

BACKGROUND OF THE INVENTION

1. Field of the Invention

The present invention relates to a method of manufacturing a thin-film transistor array substrate, and more particularly to the substrate for an active matrix liquid crystal display panel.

2. Description of the Related Art

An active matrix array substrate has a plurality of switching active elements arranged in matrix form and wirings connecting therebetween. These elements are formed by sequentially repeating deposition and patterning thin films made of a semiconductor material, insulative material and conductive material on the entire surface of one side of a glass substrate.

As for the switching active elements, thin film transistors (abbreviated as TFTs hereinafter) is used. A switching array is formed by arranging these TFTs in matrix form of rows and columns. The gate electrodes of the TFTs arrayed in the same row are connected to respective members of a first wiring (referred to as gate wiring hereinafter) group, where the wirings are connected to gate electrode terminals for receiving gate driving signals. Referring to FIG. 1, the drain electrodes 7 of the TFTs arrayed in the same column are connected to respective members of a second wiring 6 (referred to as drain wiring hereinafter) group where the wirings are connected to drain electrode terminals for receiving drain driving signals. The source electrode 12 of each TFT is connected to a transparent conductor 4 (referred to as pixel electrode hereinafter).

Lately, low power consumption of a liquid crystal display device is being demanded, which is necessitating an enhancement of the light transmittance of the liquid crystal panel. As the methods of enhancing the light transmittance it is necessary to consider such matters as the thinning of the gate and drain wirings, reduction of the space between the drain wiring and the pixel electrode, and reduction of the overlap margin of the TFT array substrate and a counter substrate (color filter or the like). However, all of these cases are in the trade-off relationship with the manufacturing yield.

In the TFT array substrate, the space between the gate or drain wiring and the pixel electrode has been made as small possible in order to have a large pixel electrode for the purpose of increasing the light transmittance of the panel. In particular, the drain wiring 6 and the pixel electrode 4 are formed on the same layer so that a short-circuit due to etching residuals is liable to occur, becoming a cause of pixel defects. In the case of a short-circuiting caused by residuals of an a-Si film 10 constituting the TFT, electrical connection occurs in the high resistance state of a-Si, making the potential applied to the transparent electrode unstable and results in a bright spot defect.

In contrast to this, in the pixel defects generated by the short-circuiting caused by the residuals in the etching of conductors constituting the drain wiring 6 or the pixel electrode 4, the voltage of the drain wiring is applied as it is to the pixel electrode and forms a defect what is called a dark spot (black spot) defect.

As a technique to eliminate the bright spot defect, a trench is formed in the space between the drain wiring and the pixel electrode during the contact hole etching process. Through the formation of the trench, even if there existed residuals of an a-Si pattern constituting the TFT between the drain wiring and the pixel electrode, the a-Si residual can be cut by carrying out the contact hole etching in the later stage by means of a dry etching. The bright spot defect in the conventional device is corrected in this manner.

However, when a light shield pattern 2 is added on a substrate 8 as shown in FIG. 1, if a trench for the purpose of cutting the a-Si film residual is formed in this site, the insulating film 9 over the light shield pattern 2 is removed, revealing the light shield pattern. Consequently, the light shield pattern 2 is exposed to, and etched along with, the etching of the drain wiring 6, and is unable to perform the intended light shielding. For this reason, when a light shield pattern is provided by this method, the residual of the a-Si film 10 is cut without exposing the light shield pattern 2 by forming a trench 140 in a TFT protective film (SiNx film of thickness 0.2 $\mu$m) 14 as shown in FIG. 1 and performing the etching in dry mode.

The insertion of a trench 140 shown in FIG. 1 has an effect of cutting the a-Si film residual and reducing the bright spot defects. Moreover, in the method of forming a trench in an element having a light shield pattern, it is necessary to carry out the etching for cutting the a-Si film residual by employing the dry mode. Here, however, the etching process of the TFT protective film 14 is a process which can be accommodated to a wet process where a batch processing of a large number of samples is possible. To perform such an etching in dry mode gives rise to such a problem as loading increase because of the impossibility of processing a large quantity of samples.

SUMMARY OF THE INVENTION

It is therefore an object of this invention to provide a method of manufacturing a TFT array substrate which makes it possible to form a trench even in the case of providing a light shield pattern in the TFT array substrate, and cut the etching residuals in the semiconductor layer which are the cause of the bright spot defects without increasing the loading in the manufacturing process of the TFT array substrate.

According to this invention, there is obtained a method for manufacturing a TFT array substrate which is characterized in that it includes a process of forming a light shielding pattern on the same plane of a glass substrate where a first wiring group constituting gate electrodes is formed arranged in parallel, a process of forming a first insulating film so as to cover the first wiring group and the light shield pattern, a process of depositing an a-Si film on desired TFT regions and regions covering at least the light shielding pattern, a process of etching regions from which a-Si film residuals are to be removed by etching, a process of forming a second wiring group constituting the source electrodes and the drain electrodes of the TFTs, and a process of forming transparent electrode films as display electrodes connected to the source electrodes. Here, the second wiring group constituting the drain electrodes is formed so as not to overlap with the a-Si film formed covering the light shielding pattern.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENT

Figure 2A:
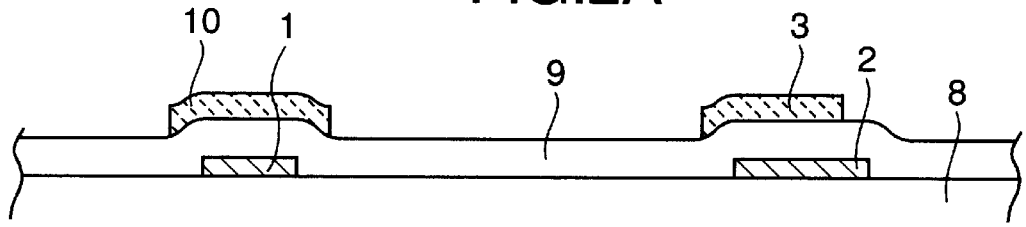
FIGS. 2A to 2E are sectional views showing the manufacturing processes of a TFT array substrate according to an embodiment of this invention.
Figure 2B:
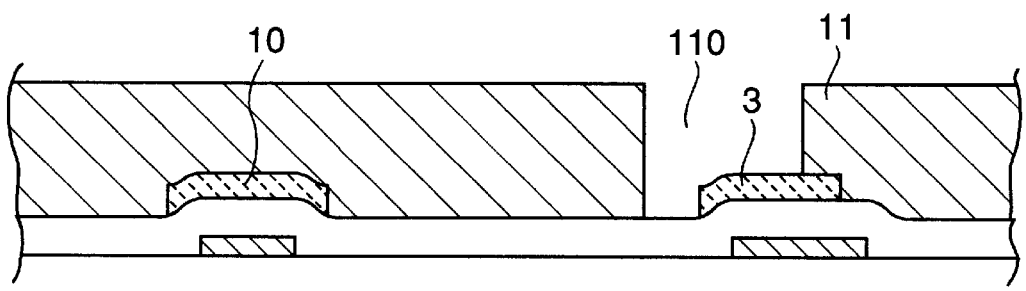
Figure 2C:
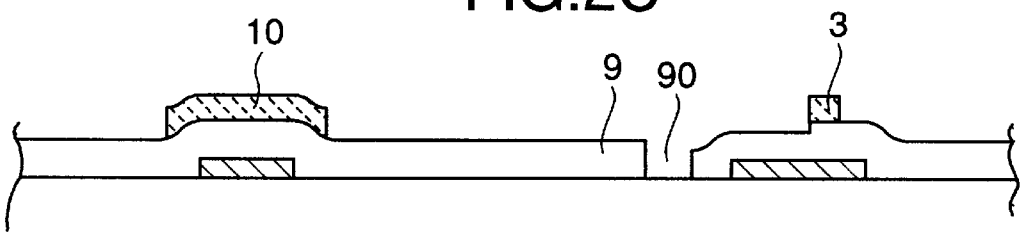

Referring to FIG. 2A, a first wiring group (gate electrode) 1 made of a metallic film (for example, a Cr film with thickness of about 0.14 μm) is formed on a glass substrate 8. At this time, a light shield pattern 2 is formed in the same process. Next, an insulating film (for example, a SiNx film with thickness of about 0.5 μm) 9 and a semiconductor film (for example, an a-Si film with thickness of about 0.4 μm) are formed in succession by plasma CVD or the like. An a-Si film 10 constituting a TFT is formed through a PR process, and an a-Si leftover film 3 which is a feature of this invention is formed at the same time. Next, as shown in FIG. 2B, coating, exposure and development of a photoresist are carried out in a PR process to form a contact hole for connecting the first wiring group to the upper metallic film. A slit 110 as trench for the purpose of cutting an a-Si film residual is opened in a photoresist film 11. This substrate is subjected to an etching in a dry etching system. FIG. 2C shows the state in which the dry etching is completed and the resist film 11 is released. In FIG. 2C, the portion of the insulating film 9 where the slit 90 is formed and the a-Si leftover film 3 are etched. In the portion where the a-Si leftover film 3 exists, the insulating film 9 is also etched following the completion of the etching of the a-Si leftover film 3. However, when a device in which the etching time is set matching with the thickness of the insulating film 9 is employed, it is possible to leave about 0.3 μm of the insulating film 9, and the light shield pattern 2 will not be revealed.

Figure 1:
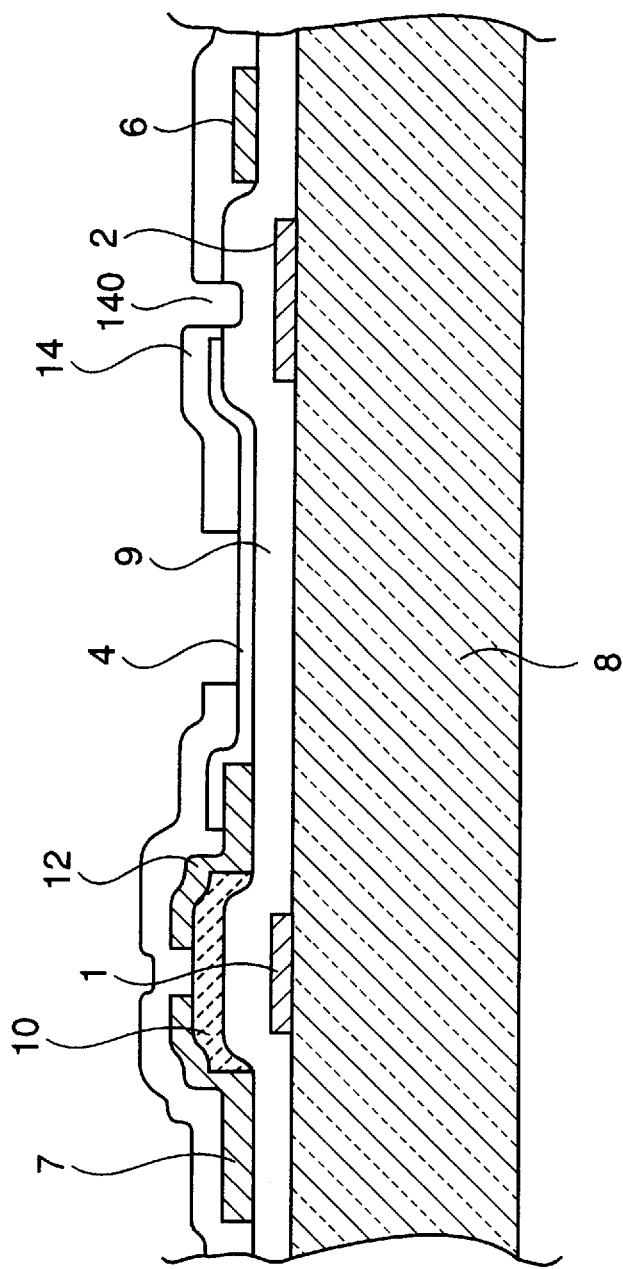
FIG. 1 is a sectional view of the TFT array substrate previously discussed.
Figure 2D:
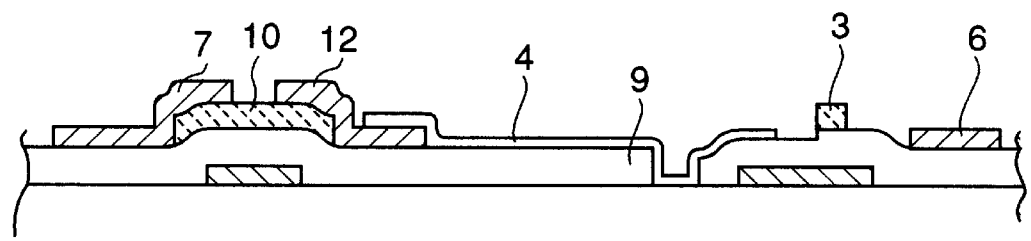
Figure 2E:
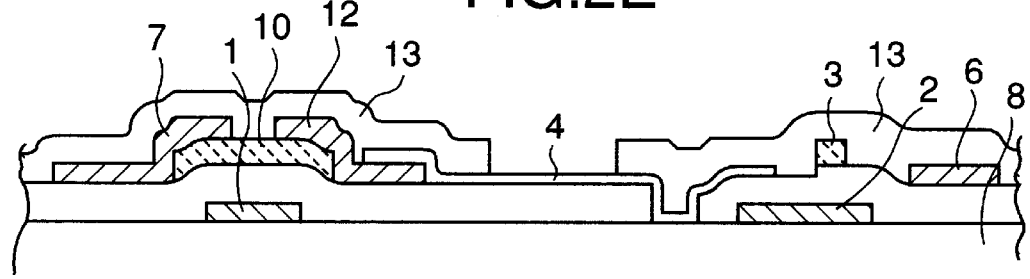
Figure 3:
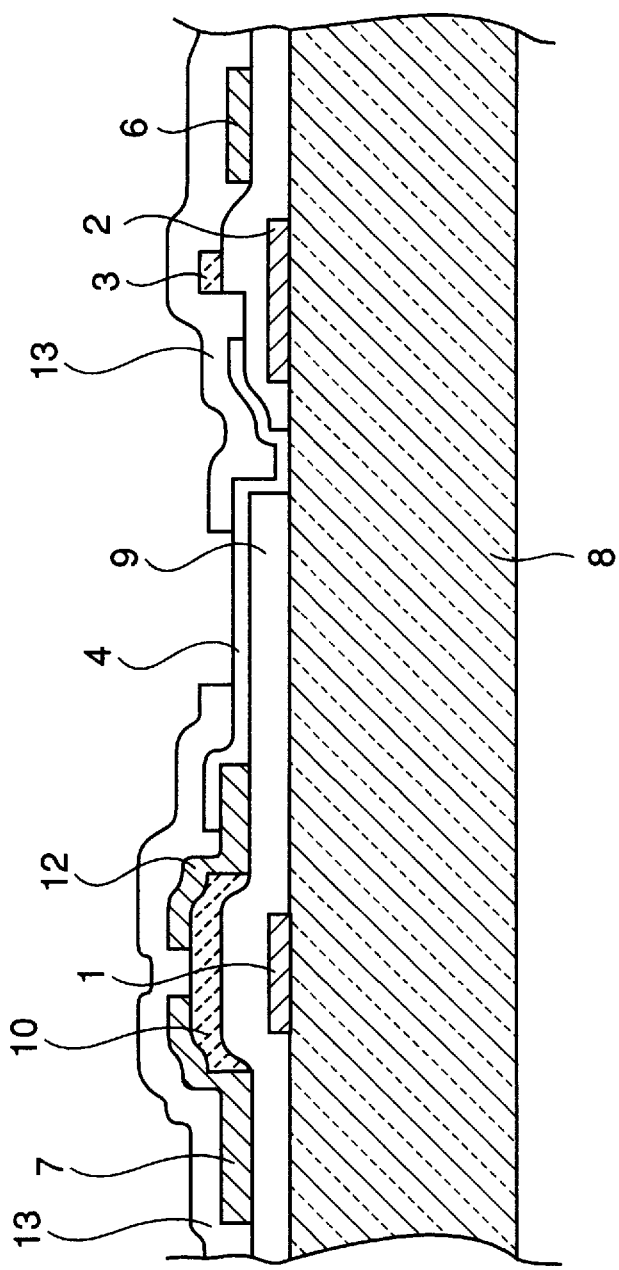
FIG. 3 is a sectional view of the TFT array substrate formed by the manufacturing method in FIG. 2.

Next, as shown in FIG. 2D, a second wiring group 6, a source electrode 12 and a drain electrode 7 (for example, a CrO film with thickness of 0.14 μm) of the TFT section, and a transparent electrode 4 (for example, an ITO film with thickness of 0.04 μm) are formed. Following this, the substrate is subjected to a channel etching. Finally, as shown in FIG. 1E, a TFT protective film 13 (for example, a SiNxO film with thickness of 0.2 μm) is formed, completing the TFT array substrate. FIG. 3 shows the completed TFT array substrate.

According to this invention, in a pixel having a light shield pattern formed in the same process of the formation of the first wiring group (gate electrode) it is possible to form a trench for cutting the a-Si etching residual causing the bright spot defect without requiring any modification in the manufacturing process, by leaving at the time of the a-Si PR process a part of the a-Si film so as to cover the light shield pattern. With such an arrangement, it is possible to provide a TFT array substrate free from the bright spot defects.

While this invention has been described in connection with a certain preferred embodiment, it is to be understood that the subject matter encompassed by way of this invention is not limited to that special embodiment. On the contrary, it is intended for the subject matter of the invention to include all alternative modifications and equivalents as can be included within the spirit and scope of the following claims.

What is claimed is:

1. A method of manufacturing a thin film transistor array substrate comprising:

a step of forming a light shielding pattern on the same plane of a substrate where a first wiring group constituting gate electrodes is formed arranged in parallel;

a step of forming a first insulating film so as to cover the first wiring group and the light shielding pattern;

a step of depositing an a-Si film on desired thin film transistor regions and regions covering at least said light shielding pattern;

a step of forming a photoresist film on the a-Si film and the first insulating film;

a step of providing a slit to expose a first portion of the insulating film and a second portion of the a-Si film located on said light shielding pattern;

a step of etching said first portion and said second portion exposed at said slit without revealing said light shielding pattern;

a step of forming a second wiring group, source electrodes and drain electrodes of the thin film transistors; and a step of forming transparent electrodes connected to said source electrodes.

2. A method of manufacturing a thin film transistor array substrate as claimed in claim 1, wherein said second wiring group is formed so as not to overlap with said a-Si film formed covering said light shielding pattern.

3. A method of manufacturing a thin film transistor array substrate comprising the steps of:

forming a gate electrode and a light shielding pattern on a substrate;

forming a first insulating film on said gate electrode, said light shielding pattern and an exposed surface of said substrate;

forming a first semiconductor film on said insulating film located on said gate electrode;

forming a second semiconductor film on said insulating film located on said light shielding pattern;

forming a trench in said insulating film adjacent to said light shielding pattern, said trench being formed by simultaneously etching a first portion of said second semiconductor film and said first insulating film adjacent to said first portion of said second semiconductor film without revealing said light shielding pattern;

forming a pair of electrodes on said first insulating film to form a thin film transistor; and forming a transparent electrode on said first insulating film located between said first semiconductor film and a leftover portion of said second semiconductor film, said transparent electrode being electrically connected to one of said pair of electrodes.

4. A method of manufacturing a thin film transistor array substrate according to claim 3, wherein said transparent electrode is elongated from one of said pair of electrodes to said trench.

5. A method of manufacturing a thin film transistor array substrate according to claim 3, wherein said substrate is exposed at said trench.

6. A method of manufacturing a thin film transistor array substrate according to claim 3, wherein said trench is coated with said transparent electrode.

7. A method of manufacturing a thin film transistor array substrate according to claim 3, wherein said first insulating film disposed on said light insulating pattern has a step portion.

8. A method of manufacturing a thin film transistor array substrate according to claim 3, further comprising a step of forming a wiring on said first insulating film without overlapping with said second semiconductor film during said step of forming said pair of electrodes.

* * * * *